United States Patent
Cazalet et al.

(10) Patent No.: US 11,943,883 B2
(45) Date of Patent: Mar. 26, 2024

(54) MAGNETIC BISTABLE HINGE SYSTEM

(71) Applicant: Google LLC, Mountain View, CA (US)

(72) Inventors: Peter Michael Cazalet, Los Gatos, CA (US); Bryan Macomber, San Francisco, CA (US)

(73) Assignee: Google LLC, Mountain View, CA (US)

( * ) Notice: Subject to any disclaimer, the term of this patent is extended or adjusted under 35 U.S.C. 154(b) by 746 days.

(21) Appl. No.: 17/070,301

(22) Filed: Oct. 14, 2020

(65) Prior Publication Data
US 2021/0112672 A1  Apr. 15, 2021

Related U.S. Application Data

(60) Provisional application No. 62/915,172, filed on Oct. 15, 2019.

(51) Int. Cl.
*H04R 1/10* (2006.01)
*H04R 1/02* (2006.01)
(Continued)

(52) U.S. Cl.
CPC ............. *H05K 5/0226* (2013.01); *H04R 1/02* (2013.01); *H04R 1/10* (2013.01); *H04R 1/1016* (2013.01);
(Continued)

(58) Field of Classification Search
CPC .......... H04R 1/02; H04R 1/10; H04R 1/1016; H04R 1/1025; H04R 1/1041; H04R 1/1091; H04R 2420/07; H05K 5/0226
See application file for complete search history.

(56) References Cited

U.S. PATENT DOCUMENTS 11,601,747 B2 *  3/2023  Macomber ........... H04R 1/1091
2002/0147026 A1  10/2002  Hsieh
(Continued)

FOREIGN PATENT DOCUMENTS

CN  1940315  4/2007
CN  101616196  12/2009
(Continued)

OTHER PUBLICATIONS

Extended European Search Report for European Patent Application No. 20201825.5 dated Apr. 13, 2021. 12 pages.
(Continued)

*Primary Examiner* — Huyen D Le
(74) *Attorney, Agent, or Firm* — Colby Nipper PLLC

(57) ABSTRACT

A magnetic bistable hinge system includes a hinge bracket, first and second magnets, and a rotatable member. The first magnet may be coupled to the hinge bracket and be configured to rotate about an axis of the hinge bracket from a first bistable position to a second bistable position. When the south pole of the first magnet is at a first angle relative to the south pole of the second magnet, the first magnet and the second magnets are in the first bistable position and the rotatable member is in a closed position relative to the hinge bracket. When the south pole of the first magnet is at a second angle relative to the south pole of the second magnet, the first and second magnets are at the second bistable position, and the rotatable member is rotated to an open position relative to the hinge bracket.

19 Claims, 12 Drawing Sheets

(51) Int. Cl.
     *H05K 5/02*     (2006.01)
     *H02J 7/00*     (2006.01)
(52) U.S. Cl.
     CPC .......... *H04R 1/1025* (2013.01); *H02J 7/0044*
                    (2013.01); *H04R 2420/07* (2013.01)

(56)                References Cited

U.S. PATENT DOCUMENTS

| | | | |
|---|---|---|---|
| 2003/0179880 | A1* | 9/2003 | Pan ................ H04M 1/0216 |
| | | | 379/433.13 |
| 2007/0138806 | A1 | 6/2007 | Ligtenberg et al. |
| 2017/0064433 | A1 | 3/2017 | Hirsch et al. |
| 2017/0094396 | A1 | 3/2017 | Chandramohan et al. |
| 2019/0069066 | A1* | 2/2019 | Song ................ E05C 19/16 |

FOREIGN PATENT DOCUMENTS

| | | |
|---|---|---|
| CN | 102112692 | 6/2011 |
| CN | 105632345 | 6/2016 |
| CN | 206603376 U | 11/2017 |
| CN | 108272201 A | 7/2018 |
| CN | 109429453 A | 3/2019 |
| CN | 109640208 A | 4/2019 |
| CN | 209488782 U | 10/2019 |
| CN | 114336806 | 4/2022 |
| EP | 2326064 A1 | 5/2011 |
| EP | 3154275 A1 | 4/2017 |
| WO | 2007028400 A1 | 3/2007 |
| WO | 2017058675 A2 | 4/2017 |

OTHER PUBLICATIONS

"Foreign Office Action", CN Application No. 202011102935.2, dated Oct. 29, 2021, 13 pages.

Office Action for Chinese Patent Application No. 202011102935.2 dated Oct. 29, 2021. 6 pages.

"Foreign Office Action", CN Application No. 202210675358.9, dated Jun. 1, 2023, 18 pages.

* cited by examiner

MAGNETIC BISTABLE HINGE SYSTEM

The present application claims the benefit of the filing date of U.S. Provisional Patent Application No. 62/915,172, filed Oct. 15, 2019, the disclosure of which is hereby incorporated herein by reference.

BACKGROUND

Many consumer products and accessories, such as charging cases, computers, and tablets, commonly require a hinge mechanism to allow for the rotation of at least one component of the product or device about an axis. Rotatable lids or covers used to close or conceal portions of such consumer products and accessories are example components that require a hinge mechanism. The manner in which the lid or cover rotates directly impacts the overall life of the product, as well as the user experience.

BRIEF SUMMARY

Aspects of the disclosure are advantageous for products and accessories requiring a hinge mechanism. For instance, aspects of the disclosure relate to a magnetic bistable hinge system that can be implemented across a wide array of products, systems, devices, and the like. One example magnetic bistable hinge system includes a hinge bracket, an axially rotatable first component coupled to the hinge bracket, a first magnet coupled to the first component, and a second magnet spaced apart from the first magnet. The first and second magnets may each include a north pole and a south pole, where the south pole of the first magnet indirectly faces in a direction toward the south pole of the second magnet. The second magnet may be positioned at an offset from a vertical axis that extends through the magnet. When the first component is rotated about the hinge bracket, the south pole of the first magnet is caused to directly face toward and oppose the south pole of the second magnet, such that the first component moves from a first closed state to a fixed and bistable open state.

According to another aspect of the disclosure, a magnetic bistable hinge assembly may comprise a hinge bracket, a first magnet, a rotatable member; and a second magnet spaced a pre-determined distance away from the first magnet. The first magnet may be coupled to the hinge bracket and configured to rotate about the axis of the hinge bracket from a first bistable position to a second bistable position. The rotatable member may be coupled to the hinge bracket and the first magnet. A second magnet may be spaced a pre-determined distance away from the first magnet. The size of the second magnet may be greater than a size of the first magnet. The south pole of the first and second magnets may face in a direction toward one another. When the south pole of the first magnet is at a first angle relative to the south pole of the second magnet, the first magnet and second magnets are in the first bistable position and the rotatable member may be secured in a closed position relative to the hinge bracket. When the south pole of the first magnet is at a second angle relative to the south pole of the second magnet, the first and second magnets are at the second bistable position, and the rotatable member is rotated to an open position relative to the hinge bracket.

In one example of this aspect, the first magnet may be positioned within the first rotatable member. The rotatable member may include a first and a second opposed end. The first magnet may be positioned at the first end of the rotatable member, such that movement of the first magnet causes the second opposed end to rotate about the hinge bracket. The first rotatable member may include a first end facing away from the first magnet and a second end facing the opposite direction, wherein the magnet is at the first position. The first magnet may face in a direction of the second opposed end.

In another example, the rotatable member may be rotated to the open position, such that the rotatable member is at a position 20 degrees greater than the closed position.

In another example, the system magnet may be fixed at an angle ranging from 10 to 30 degrees relative to a vertical axis.

According to another aspect of the disclosure, a magnetic bistable hinge system includes a hinge bracket, a rotatable member, and a system magnet. The rotatable member may be coupled to the hinge bracket and configured to rotate about the hinge bracket between a first bistable position to a second bistable position. The hinge magnet may be positioned at a base of the rotatable member. A system magnet may be spaced a pre-determined distance away from the hinge magnet, and wherein a south pole of the hinge magnet indirectly faces toward the south pole of the system magnet. The south pole of the hinge magnet is at a first angle relative to the south pole of the system magnet, the first rotatable member is in the first bistable position. The south pole of the hinge magnet is at a second angle relative to the south pole of the system magnet, the first rotatable member is repelled to the second bistable position.

In one example of this aspect, when the south pole of the hinge magnet is at the second angle relative to the south pole of the system magnet, the south poles of the first hinge and system magnets directly face one another. Additionally, when the south poles of the hinge and system magnets do not directly or indirectly face one another, the rotatable member is in a third fully open position relative to the hinge bracket.

In another example, a housing may be positioned between the hinge magnet and the system magnet, so as to space the hinge magnet and system magnet apart from one another by the predetermined distance.

According to another aspect of the disclosure, a system includes an outer housing, a rotatable cover coupled to the outer housing; a first magnet, a magnetic bistable hinge system disposed within the outer housing, a position sensor, and a control device. The first magnet may be disposed within the outer housing and have a north pole and a south pole. The magnetic bistable hinge system may further include a hinge bracket, an axially rotatable first component coupled to the hinge bracket and the rotatable cover; and a second magnet. The second magnet may be disposed within the first component and be rotatable about the hinge bracket. The second magnet may also be spaced away from the first magnet and have a north pole and a south pole. The second magnet may be greater in size than the first magnet. The first component may be in a first closed position when the south pole of the second magnet indirectly faces in a direction toward the south pole of the first magnet. The first component may be in a second open bistable position when the south pole of the first magnet directly faces toward and opposes the south pole of the second magnet, such that the first component and the rotatable cover moves from a first closed position to a bistable open position. A position sensor may be configured to send a signal to a control device indicating a location of the second magnet. The control device may include one or more processors configured to receive the signal from the position sensor; and determine a current position of the first component based on the signal received from the position sensor.

According to another aspect of the disclosure, a magnetic bistable hinge system includes a hinge bracket, first and second magnets, and a rotatable member. The hinge bracket includes an axis extending therethrough. The first magnet may be coupled to the hinge bracket and be configured to rotate about the axis of the hinge bracket from a first bistable position to a second bistable position. The first magnet may have a north pole and an opposed south pole. The rotatable member may be coupled to the hinge bracket and the first magnet. The second magnet may be spaced a pre-determined distance away from the first magnet and have a north pole and an opposed south pole. The south pole of the first and second magnets may face in a direction toward one another. When the south pole of the first magnet is at a first angle relative to the south pole of the second magnet, the first magnet and the second magnets are in the first bistable position and the rotatable member is in a closed position relative to the hinge bracket. When the south pole of the first magnet is at a second angle relative to the south pole of the second magnet, the first and second magnets are at the second bistable position, and the rotatable member is rotated to an open position relative to the hinge bracket.

In one embodiment of this aspect, a first size of the first magnet is smaller than a second size of the second magnet.

In another embodiment of this aspect, the rotatable member may further include a first end and a second opposed end. The first magnet may be positioned at the first end of the rotatable member, such that movement of the first magnet causes the second opposed end to rotate about the hinge bracket into the second bistable position. Additionally, the first end of the rotatable member may face toward the second magnet and the second end of the rotatable member may face away from the second magnet.

According to another embodiment of this aspect, the rotatable member is rotated to the open position, the rotatable member may be at a position at least 20 degrees greater than the rotatable member in the closed position.

According to another embodiment, wherein when the first magnet moves from the first bistable position to the second bistable position, the magnet is rotated at least 20 degrees.

According to another aspect of the disclosure, a magnetic bistable hinge system includes a hinge bracket, an axially rotatable first component coupled to the hinge bracket, and first and second magnets. The first magnet may be coupled to the first component and have a north pole and a south pole. The second magnet may be spaced apart from the first magnet and have a north pole and a south pole. The second magnet may be positioned at an angle offset from a vertical axis that extends through the second magnet. The first component may be is in a first closed state when the south pole of the first magnet indirectly faces in a direction toward the south pole of the second magnet. Rotation of the first component about the hinge bracket causes the south pole of the first magnet to directly face toward and oppose the south pole of the second magnet, such that the first component moves from the first closed state to a fixed and bistable open state.

According to an example of this aspect of the disclosure, the first magnet may be positioned at a base of the first component.

According to another example of this aspect, the first magnet has a first size that is smaller than a second size of the second magnet. Additionally, the size of the second magnet may be at least two times greater than the first size of the first magnet.

According to another example of this aspect, at least one of the first component and the hinge bracket is comprised of a ferromagnetic material. Additionally, in some examples, both the hinge bracket and first component include a ferromagnetic material.

According to another aspect of the disclosure, a system includes an outer housing, a rotatable cover coupled to the outer housing, first and second magnets and a hinge subassembly. The first magnet may be disposed within the outer housing and have a north pole and a south pole. The hinge subassembly may be disposed within the outer housing and can further include a hinge bracket, an axially rotatable first component coupled to the hinge bracket and the rotatable cover, and a second magnet rotatable about the hinge bracket. The second magnet may be spaced away from the first magnet and have a north pole and a south pole. The first component may be in a first closed position when the south pole of the second magnet indirectly faces in a direction toward the south pole of the first magnet. The first component may be in a second open bistable position when the south pole of the first magnet directly faces toward and opposes the south pole of the second magnet, such that the first component and the rotatable cover automatically move from a first closed position to a bistable open position.

In one example of this aspect, the second magnet may be positioned within the first component and the first magnet may be is further configured to secure a removable and external device to an interior of the outer housing. Additionally, the first component can further include a first end and a second opposed end. The second magnet may be positioned at the first end of the first component, such that movement of the first magnet causes the second opposed end to rotate about the hinge bracket.

In another example of this aspect, the system may further include a position sensor and a control device. The position sensor may be configured to indicate a location of the second magnet. The control device may include one or more processors configured to receive the signal from the position sensor; and determine a current position of the first component based on the signal received from the position sensor. Additionally, the current position of the second magnet indicates whether the first component is in one of the first closed position and the second bistable open position.

In another example of this aspect, the position sensor may be a hall sensor configured to detect the location of the second magnet. Additionally, the position sensor may be a plurality of hall sensors.

In another example of this aspect, the position sensor may be positioned within the hinge bracket.

DETAILED DESCRIPTION

Figure 1:
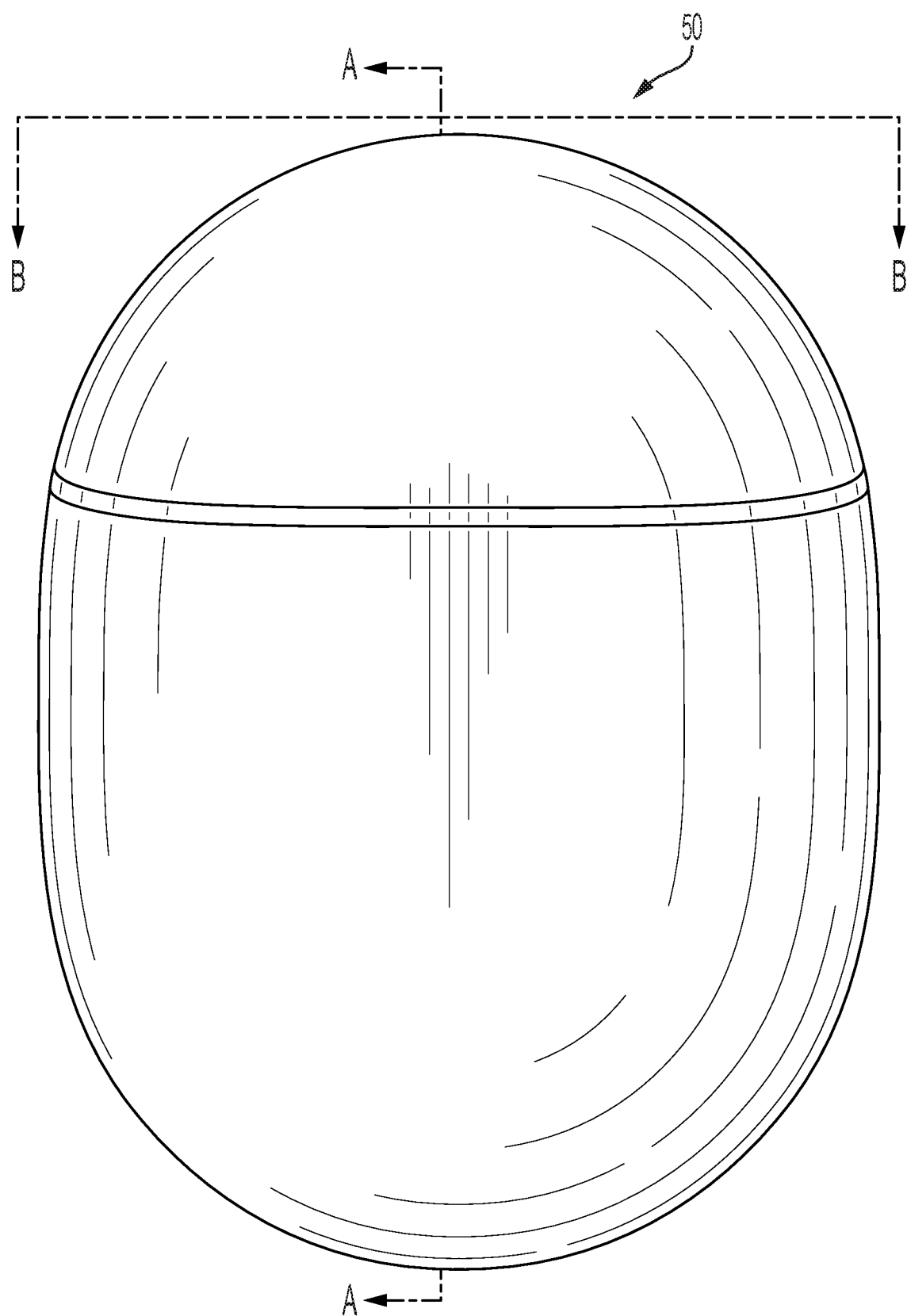
FIG. 1 is an example charging case according to aspects of the disclosure.

The use of hinge systems to provide the necessary rotatable movement of component parts of devices is well known in the art. However, many of these hinge systems are complex, require the use of springs, a ratchet and pawl mechanism, or the like, and generally require multiple associated components. In time, such hinge systems become worn down and components of such hinge systems fail. Thus, there is a need for improved hinge systems for consumer products and the like.

To address these shortcomings, an improved hinge system can be integrated within the housing of a device, such as an electronic charging case. In accordance with aspects of the disclosure, the improved hinge system can implement a magnetic bistable hinge system that will allow for rotation of the lid of an electronic charging case about an axis, as well as control movement of the lid about the axis. For example, such magnetic bistable hinge mechanism will enable the lid to move from a first closed position to a bistable open position, as well as a fully open position. The ease with which a user can open and close the lid greatly improves the user experience, as well as improves the overall reliability and durability of both the product and the hinge system. It additionally helps to provide greater control for the opening and closing of the lid.

According to aspects of the disclosure, a device incorporating a magnetic bistable hinge system can include a computer, an electric charging case, a tablet and the like. For ease of discussion, a magnetic bistable hinge system will be discussed in the context of an electric charging case, but it is to be appreciated that the bistable hinge system disclosed herein may be used in a wide variety of applications, devices, and larger systems. The electric charging case may include a primary housing and a lid. Implementing an example magnetic bistable hinge system within charging case can allow for the lid to freely move from a closed position to a set bistable open position, as well as into a fully open or extended position.

An example magnetic bistable hinge system can further include a first rotatable assembly plate that is coupled to the lid of a charging case. The first rotatable plate may rotate about the axis of a pin attached to a hinge bracket. A first magnet may be positioned within the first plate. A second magnet may be spaced away a predetermined distance from the first magnet and positioned within a housing that separates the first and second magnets.

When the lid is in the closed position, the first magnet and second magnet may be positioned so that the south pole of the first magnet indirectly faces the south pole of the second magnet. This causes the first and second magnets to repel one another and create a downward force on the hinge to secure the hinge in the closed position. When a user opens the lid, the magnets repel each other at the bistable point causing the hinge to flip open. In the bistable position, the south pole of the first magnet and the south pole of the second magnet directly face one another. Due to the positioning of the first and second magnets relative to one another, the rotatable plate and lid directly open to the bistable position from the close position. When a user desires to open the lid all of the way, the user can apply a force that overcomes the polarity of the magnets, and allows the lid to remain open and fully extended.

A control system can determine the position of the lid of the charging device. For example, the control system may be able to detect the position of the second magnet, which will indicate the position of the lid. The position of the lid can be a first closed position or an open position (either bistable open position or otherwise). At least one position sensor can be implemented within the charging device to determine the magnitude or magnetic field generated by the hinge magnet, as it rotates about the hinge bracket and causes rotation of the rotatable assembly plate and lid. An example sensor can be a hall effect sensor.

Example Magnetic Bistable Hinge System for Example Charging Case

Figure 2:
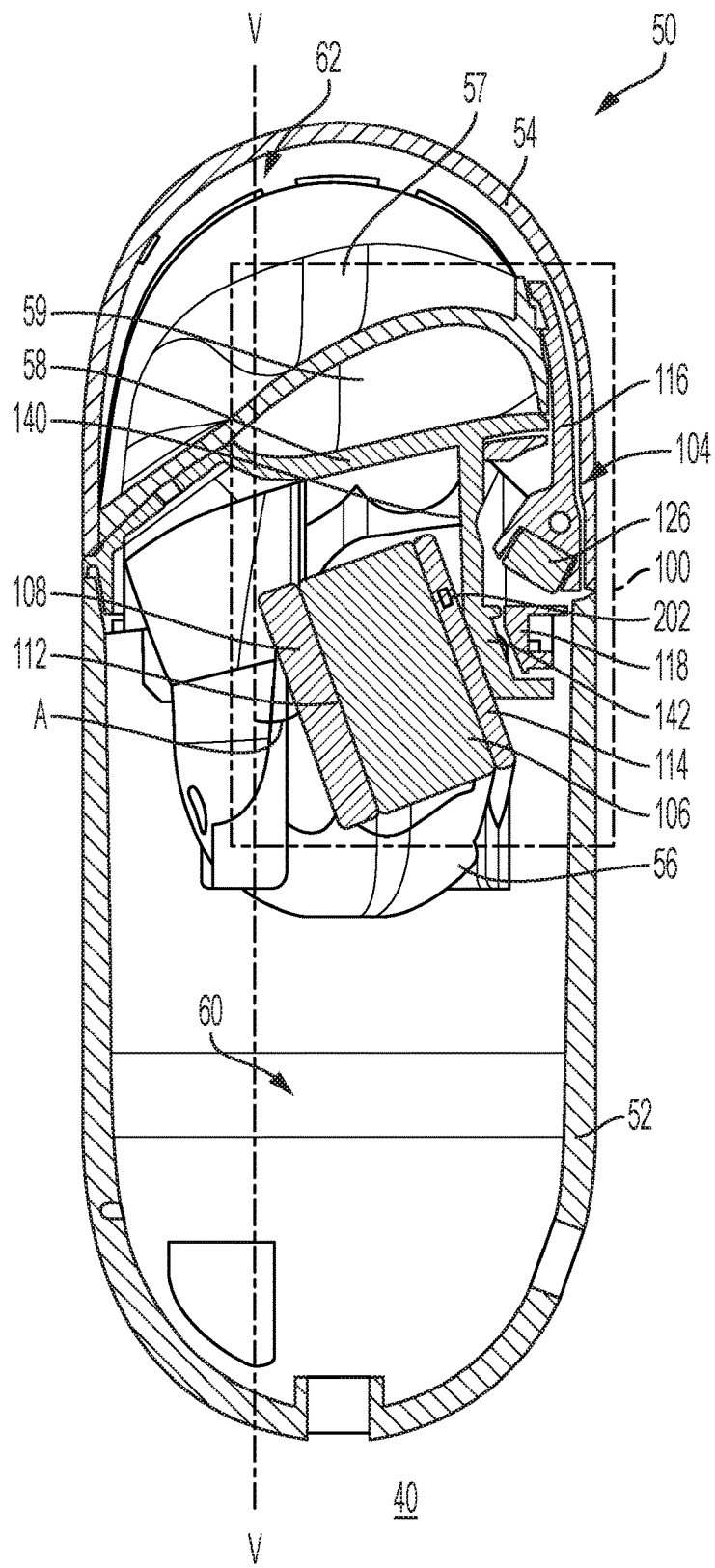
FIG. 2 is a cross-sectional view of FIG. 1 taken across line A-A.
Figure 3:
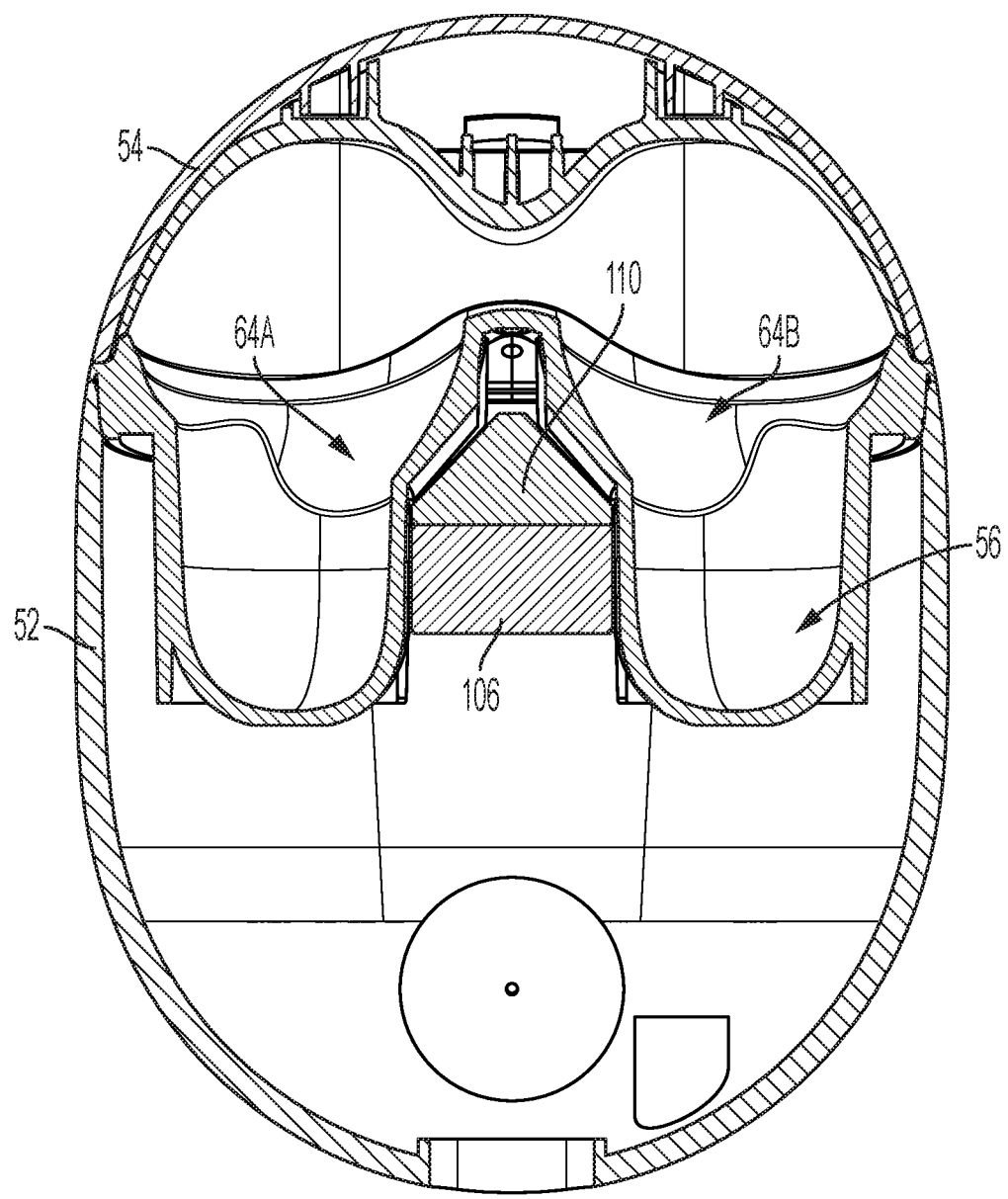
FIG. 3 is a cross-sectional view of FIG. 1 taken across line B-B.
Figure 11:
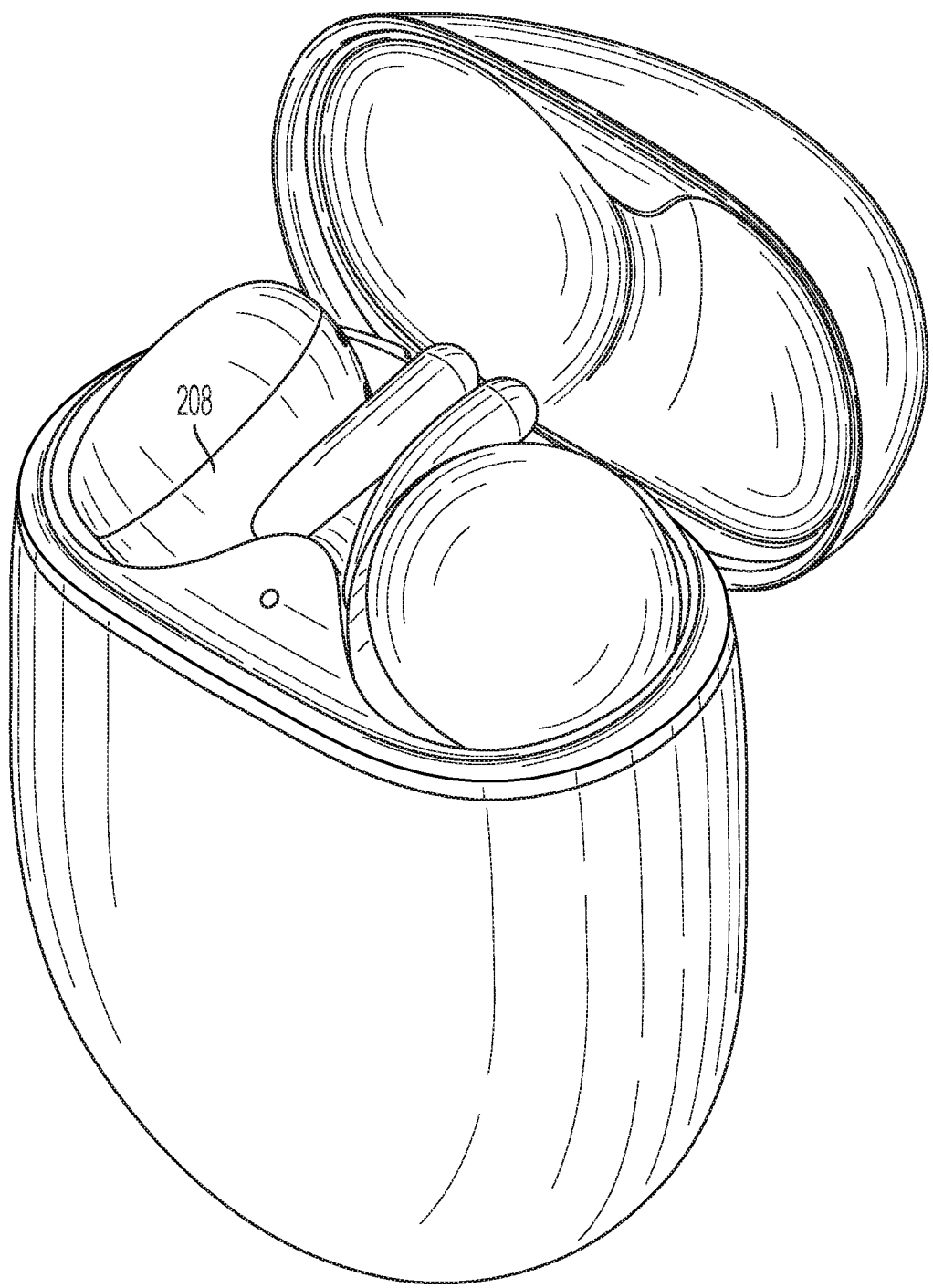
FIG. 11 is a perspective view of an example charging case with example earbuds therein according to an aspect of the disclosure.

FIG. 1 is an example 40 of a charging case 50 according to aspects of the disclosure and FIG. 2 is a cross-sectional view of charging case 50 showing an example magnetic bistable hinge system 100. As shown, charging case 50 includes an elongated main body 52 and lid 54 that are rotatably connected to one another. A lower interior housing 56 may be seated within a cavity 60 of the main body 52 of charging case 50. An upper interior housing 57 is seated within a cavity 62 of the lid 54 of charging case 50. The top surface 59 upper interior surface 59 of the lid 54 is shown directly adjacent the top surfaces 58 of the interior housing 57 of the main body 52 when the lid 54 is closed. Referring to FIG. 3, another cross sectional view, the interior housing 56 includes recesses 64A and 64B that can be used to receive and charge an electronic device or accessory, such as wireless earbuds 208 (FIG. 11) or the like. The main body 52 and lid 54 are shown as having a rounded profile, but in other examples, the main body 52 and lid 54 can take on a variety of different shapes and sizes.

A magnetic bistable hinge system 100 may be utilized within various devices to allow for movement of components of the device. In one example, magnetic bistable hinge system 100 may be implemented within example charging case 50, to allow for movement of the lid 54 about the main body 52. As shown in FIG. 2, magnetic bistable hinge system 100 can include a hinge subassembly 104 and a system magnet 106.

System magnet 106 may be positioned within the interior housing 56 of the main body 52. A system magnet housing 108 can be used to retain system magnet 106 within the interior of charging case 50 and in close proximity to the hinge subassembly 104. As shown, system magnet 106 is positioned at an angle relative to a vertical axis V-V that extends through a length of charging case 50. In one example, the magnet is offset by an angle A, which is a pre-determined angle or number of degrees from vertical axis V-V, such as at least 20 degrees. But, in other examples, the magnet may be offset by greater than or less than 20 degrees or there may be no offset at all. Similarly, the degree of offset may range between 15-45 degrees. System magnet 106 is shown oriented so that north pole 112 faces toward the front of charging case 50 and its south pole 114 faces toward the back of charging case 50 and toward hinge subassembly 104.

In one example, as shown in FIG. 3, system magnet 106 may be secured between the recesses 64A and 64B of charging case 50. System magnet 106 may be shaped like a house with a rectangular lower portion and a sloped and triangular-shaped upper portion. This is in part due to the shape of the space created between the recesses 64A, 64B. But, in other examples, the shape and size of the magnet may differ. Further, the system magnet may be formed from two or more smaller magnets that may be joined together or spaced apart from one another. Due to its location and size, system magnet 106 can serve a dual purpose and also secure any electronic devices that may be positioned within the respective recesses 64A and 64B. For example, ear buds (not shown) may be secured by the system magnet 106 within the charging case 50.

Figure 4:
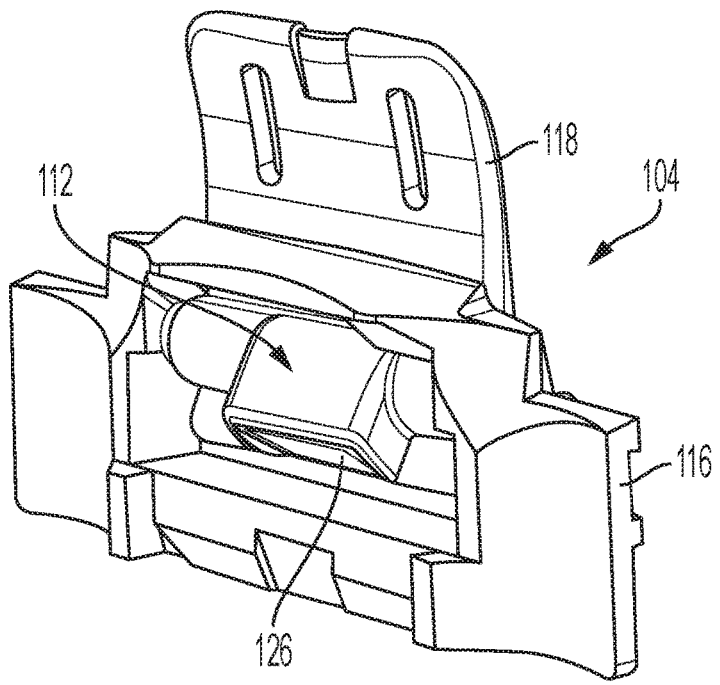
FIG. 4 is an example hinge subassembly according to aspects of the disclosure.
Figure 5:
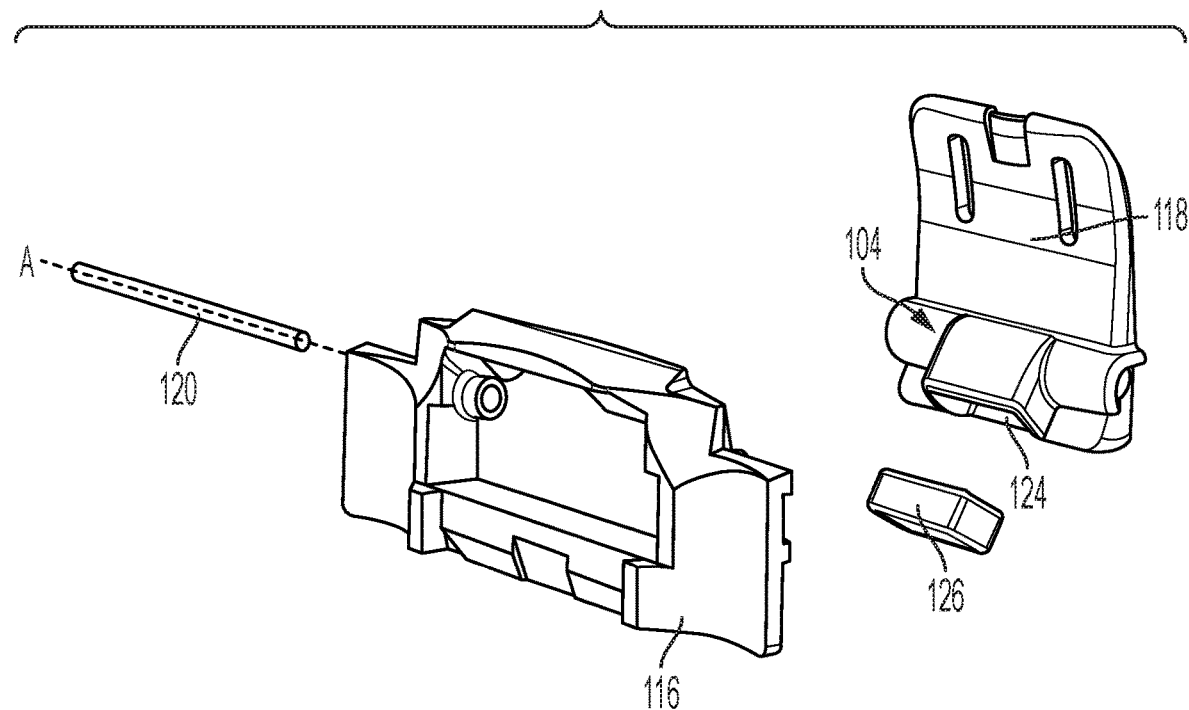
FIG. 5 is an exploded view of FIG. 4.

FIGS. 4 and 5 illustrate an example hinge subassembly 104 of the magnetic bistable hinge system 100. The hinge subassembly 104 may include a hinge bracket 116 and a rotatable assembly plate 118 fixed to the hinge bracket 116 by a pin 120. The hinge bracket 116 may be coupled to a rear portion of the main body using known methods. The hinge bracket 116 can be used to secure the rotatable assembly plate 118 in place, as well as limit and guide rotational movement of the assembly plate 118.

The assembly plate 118 may extend between the main body 52 and lid 54 of charging case to couple these two components together. The assembly plate 118 includes an elongated body that extends within and couples to the lid 54. Movement of the assembly plate 118 can cause lid 54 to move from a closed position to a bistable open position, as discussed further below.

Figure 6:
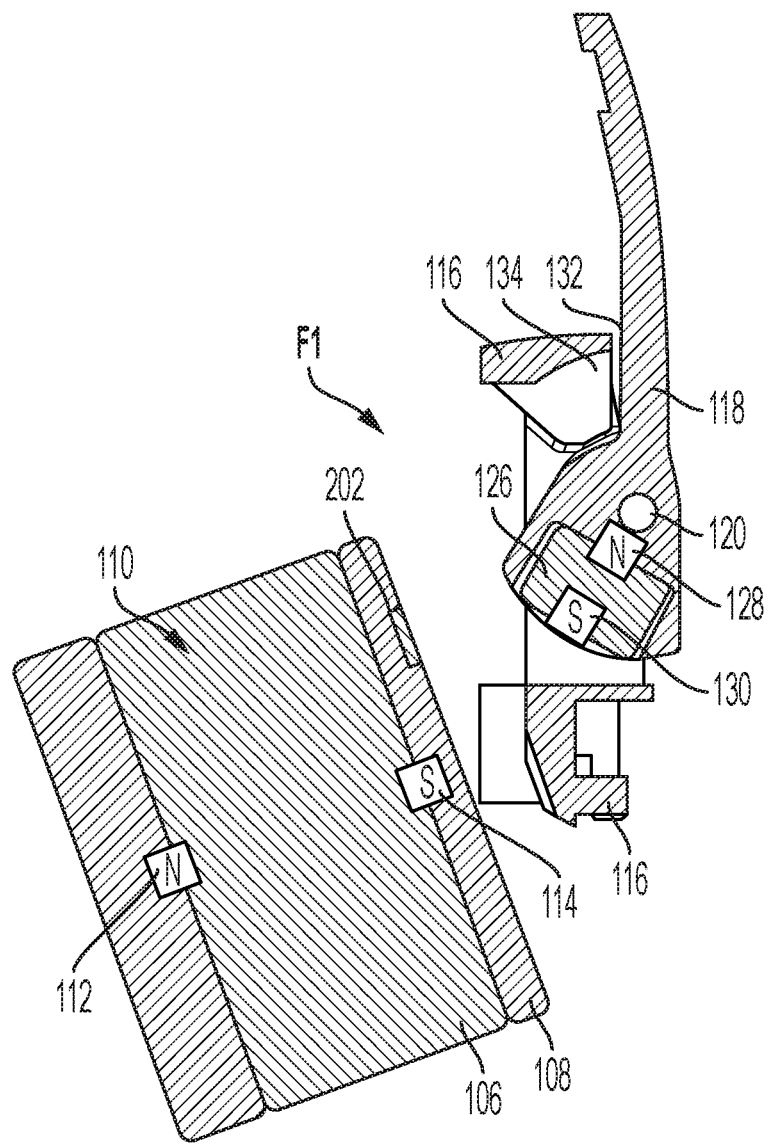
FIG. 6 is a schematic view of only the magnetic bistable hinge system according to aspects of the disclosure.

The base 122 of assembly plate 118 may include a recess 124 (FIG. 5) for receiving a hinge magnet 126. Hinge magnet 126 may be positioned within the assembly plate 118, such that when assembly plate 118 rotates, hinge magnet 126 rotates with the assembly plate 118 about the axis A of pin 120. As shown in FIG. 6, the north pole 128 of hinge magnet 126 faces toward the top of charging case 50 and the south pole 130 of the hinge magnet 126 faces toward the bottom of charging case 50. Similarly, the assembly plate includes a first end facing toward the system magnet 106 and an opposed second end facing away or positioned further away from system magnet 106. Hinge magnet 126 may be positioned at the first end of assembly plate 118, such that movement of the magnet causes the opposed second end to rotate from the first bistable or closed position to a second bistable or open position, as discussed more fully below.

The assembly plate 118 and hinge bracket 116 may be comprised of a ferromagnetic material, such as iron or iron alloys, to enhance the magnetic features of the hinge subassembly 104 and to allow for attraction of these components to the system magnet 106. In other examples, the assembly plate 118 and hinge bracket 116 may be comprised of different materials, such as steel, other metals, or non-metals. Alternatively, only one of the assembly plate 118 and hinge bracket may be comprised of a ferromagnetic material.

With reference back to FIG. 2, system magnet 106 and the hinge magnet 126 may differ in size and magnitude. As shown, system magnet 106 may be significantly larger in size than hinge magnet 126. This allows for system magnet 106 to create a large magnetic field. System magnet 106 may have a magnitude of strength greater than the magnitude of strength relative to the rotatable magnet 126. By way of example only system magnet 106 may have a magnitude of 384 G and hinge magnet 126 may have a magnitude of 52 G. In other examples, the magnitude of the system magnet 106 may be greater or less than 384 G. Similarly, hinge magnet 126 may have a magnitude less than or greater than 52 G. In this regard, the magnitude, shape and sizes of the magnets may be different. For example, a smaller system magnet 106 may be utilized that has a significantly greater magnitude than the hinge magnet and can achieve the same results as disclosed herein. In still another example, the size of the magnets may be the same.

When lid 54 is in the closed position, hinge magnet 126 is spaced apart from system magnet 106 by a predetermined distance such as, for example, 0.1 inches. In other examples, the system magnet 106 may be positioned within a range of predetermined distances away from hinge magnet 126, such as between 0.01 to 0.30 inches. But, in still other examples, the hinge may be at a distance less than 0.01 inches or greater than 0.30 inches. Housing wall 140 may be positioned between system magnet 106 and hinge magnet 126. In one example, housing wall 140 includes an angled wall surface 142 that abuts the housing 108 of system magnet 106. The angled wall surface 142 may have a same angle relative to vertical axis V-V, as system magnet 106 can help to secure system magnet 106 at the desired angle. In an example where the system magnet may not be positioned at a fixed angle, the housing wall may be a continuously planar wall.

FIG. 6 is an enlarged cross-sectional schematic view showing components of the bistable hinge system 100 in the closed position and removed from the remainder of the charging case for ease of discussion. As shown, south pole 130 of hinge magnet 126 is positioned toward a top portion or an upper end 110 of system magnet 106. South pole 114 of hinge magnet 126 faces toward the south pole 114 of hinge magnet 126, such that south pole 130 of hinge magnet 126 is positioned at an angle to the south pole 114 of system magnet 106. The south pole 130 of hinge magnet 126 does not extend parallel to the south pole 144 of system magnet 106. In this regard, the south pole 130 indirectly faces the south pole 114 of system magnet 106. In an alternative embodiment, the north poles may instead be oriented to indirectly face each other and repel one another to achieve the same or similar effect discussed herein.

The system magnet 106 and hinge magnet 126 cause the lid 54 to remain closed. As shown, the south pole 114 of system magnet 106 repels south pole 130 of hinge magnet 126 and creates a downward or pre-loaded force F1 on the hinge subassembly 104 and the rotatable assembly plate 118. The downward force F1 causes rotatable plate 118 to be rotated towards hinge bracket 116. Interior surface 132 of the rotatable assembly plate 118 abuts an outer surface 134 of hinge bracket 116, such that outer surface 134 stops assembly plate 118 from further rotating about pin 120. The downward force F1 causes the lid to remain closed. It is to be appreciated that in other examples, the north poles of the hinge magnet 126 and the system magnet 106 may instead be oriented toward and repel one another.

Figure 7:
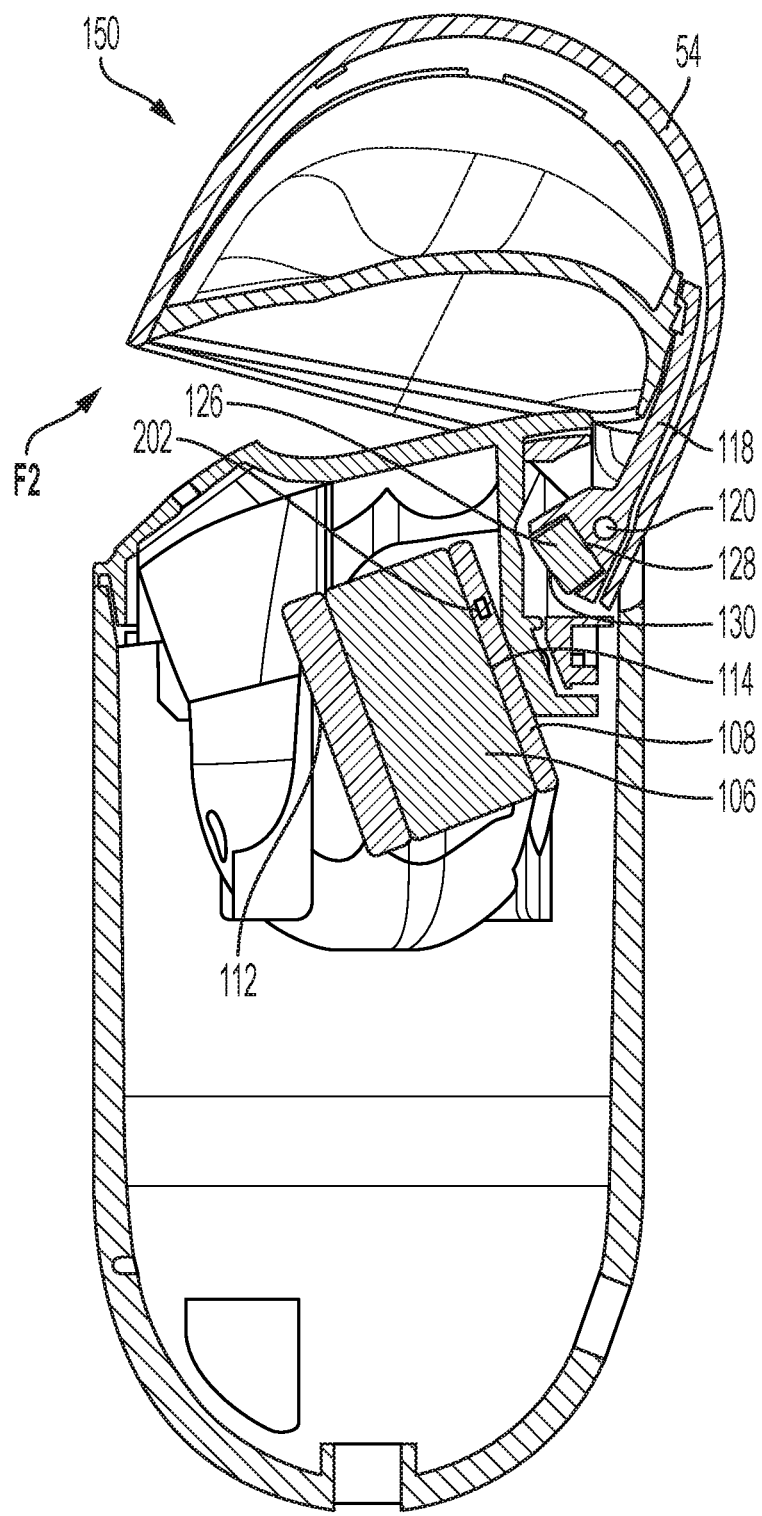
FIG. 7 is a cross-sectional view of the magnetic bistable hinge system in the bistable position according to aspects of the disclosure.
Figure 8:
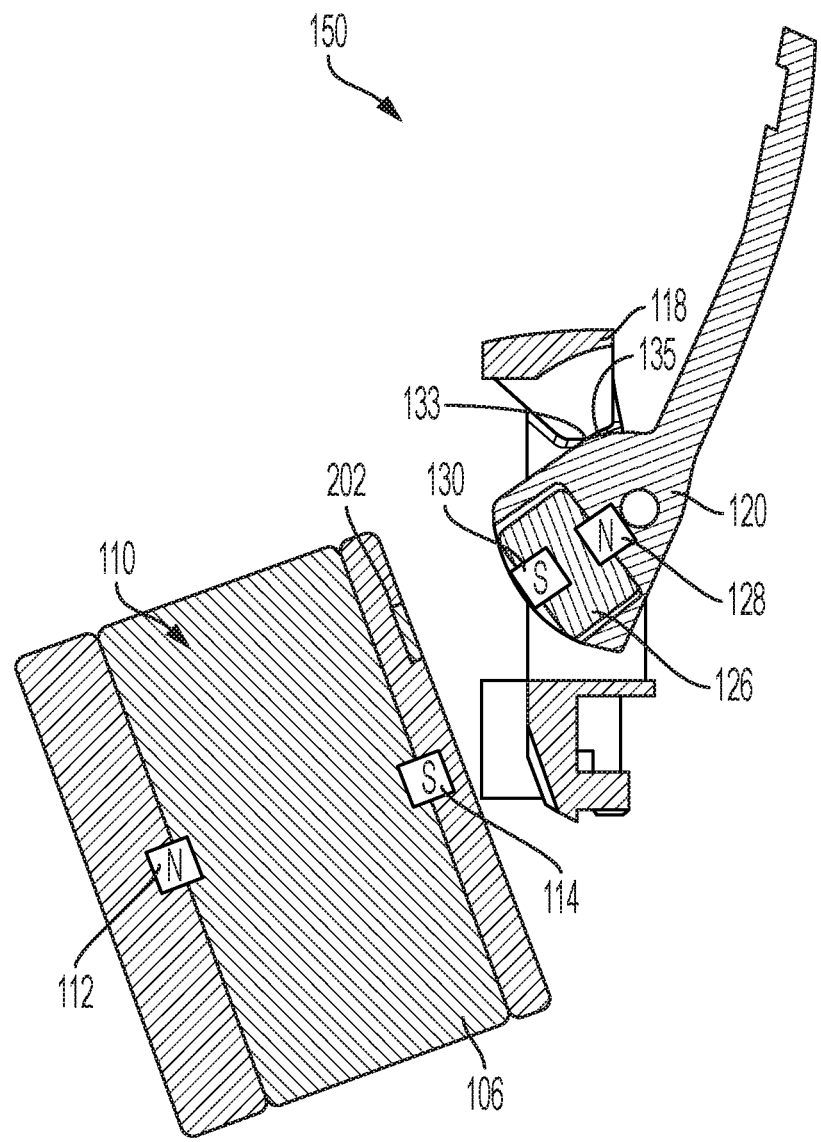
FIG. 8 is a cross-sectional view of only the components of the magnetic bistable hinge system in the bistable position according to aspects of the disclosure.

Turning to FIG. 7, the lid 54 is shown in an open and bistable position 150. When an opening force F2 is applied to the lid 54 and hinge subassembly 104 that overcomes the pre-loaded force F1, the lid automatically opens to a bistable position 150. It does not open to an intermediate position between the bistable position 150 and the closed position. FIG. 8 shows an enlarged and schematic view of the bistable hinge system 100 in the bistable position 150. The bistable point occurs where the south pole 130 of the hinge magnet 126 directly faces the south pole 114 of the system magnet 106. In this example, the south pole 130 of the hinge magnet 126 directly faces the top portion 110 of the system magnet 106. The south pole 130 of hinge magnet 126 and the south pole 114 of the system magnet 106 repel each other at the bistable point, which causes the assembly plate 118 and lid 54 (FIG. 2) to rotate about the pin 120 and flip open to the bistable point. In the bistable open position 150, as also shown in FIG. 8, the lower interior surface 133 can abut the lower outer surface 135 of the hinge bracket 116. Further, the hinge magnet 126 may be rotated from the first bistable position into the second bistable open position 150 by moving at least approximately 20 degrees. In other examples, rotation can occur by moving the hinge magnet greater than or less than 20 degrees.

Use of the system and hinge magnets 106, 126 allows for minimal friction within the bistable hinge system 100. The system and hinge magnets 106, 126 eliminate the need for additional components in the hinge system, such as springs, pawl and ratchet, and the like, to achieve movement of the lid 54. The only friction occurs between assembly plate 118 and pin 120, as assembly plate 118 rotates about pin 120. The reduced friction in the bistable hinge system 100 further prevents lid 54 from being placed or stuck in an intermediate position between the bistable position 150 and the closed position. This allows for smooth movement of the lid 54 from the closed to bistable open position 150 and vice versa, which enhances the user experience.

Figure 9:
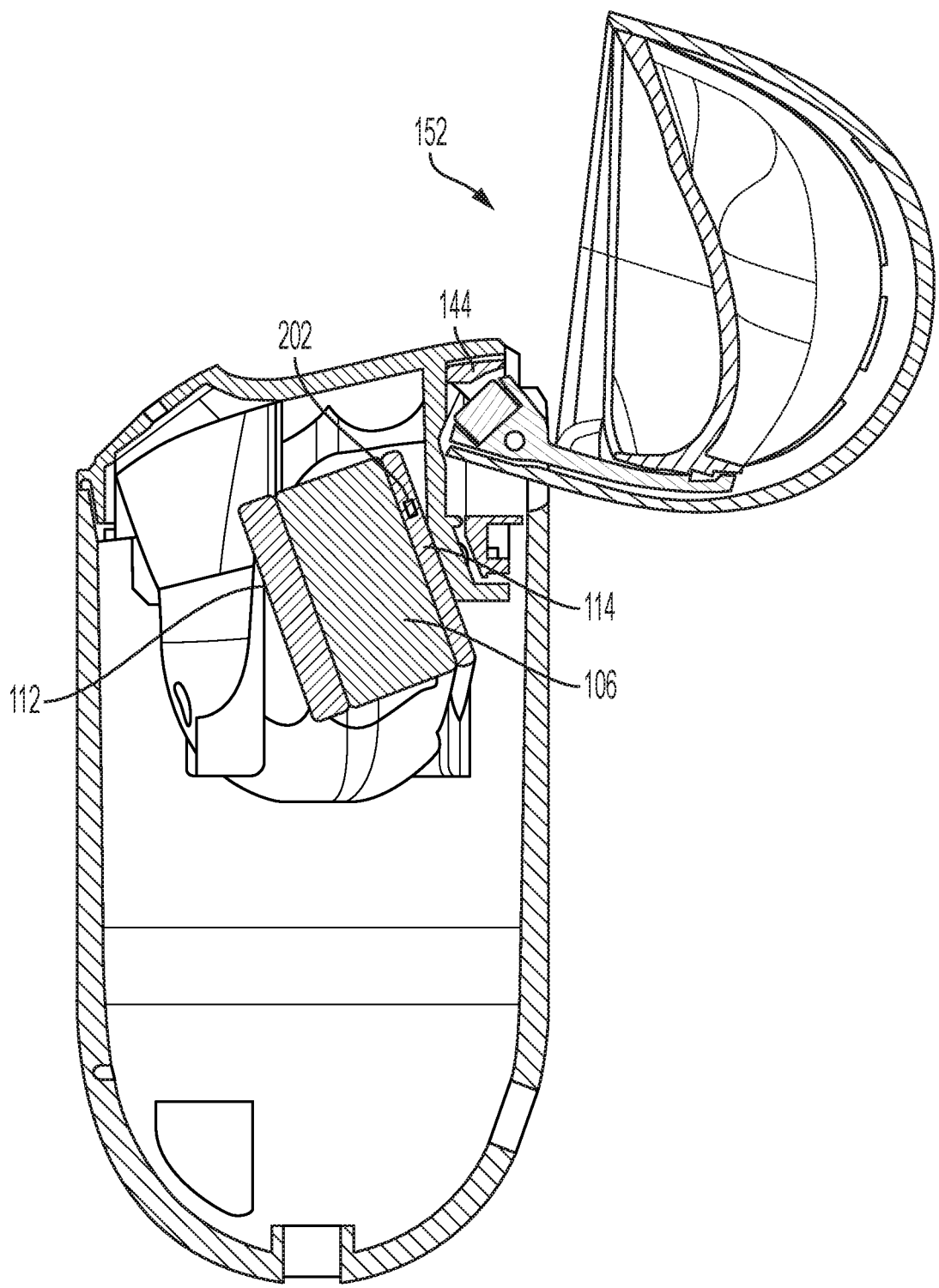
FIG. 9 is a cross-sectional view of the components of the magnetic bistable hinge system in a fully extended and open position according to aspects of the disclosure.

FIG. 9 shows the lid 54 in a fully open and extended position 152. In the extended position, the assembly plate 118 rotates around the pin 120 until south pole 130 of the hinge magnet 126 faces away from the south pole 114 of the system magnet 106 and breaks the magnetic field. A stopping surface 144 on the hinge bracket 116 prevents over rotation of the assembly plate 118 and retains the lid 54 in a fixed fully open and extended position.

In this example, cover 54 of charging case 50 is capable of moving from a first bistable position, i.e., a closed position, to a second bistable position, i.e., an open position. In the first bistable position, the south pole 130 of hinge magnet 126 can be at a first angle relative to system magnet 106. (FIG. 6) For example, south pole 30 of hinge magnet 126 will indirectly face toward south pole 114 of system magnet 106. In the second bistable position, south pole 130 of hinge magnet 126 will be at a second angle relative to system magnet 106. (FIG. 8.) The south pole 130 of hinge magnet 126 will more directly face toward south pole 114 of system magnet 106, such that south pole 130 and south pole 114 are almost parallel to one another. Finally, to disengage the magnets and completely open the cover 56, south pole 130 of hinge magnet 126 can be moved to a third angle relative to system magnet, in which the magnets no longer repel one another and the lid is in a fully open position. (FIG. 9.) In such position, the south pole 30 of hinge magnet 126 may extend in a direction that is almost perpendicular to system magnet 106.

In other example embodiments, the first bistable (closed) and second bistable (open) positions can be still be achieved and/or modified by modifying features of one or both of the system and hinge magnets 106, 126. For example, the position and amount of space between the retention and hinge magnets 106,126 relative to one another, the magnitude of the retention and hinge magnets 106,126, and the size of the retention and hinge magnets 106, 126 each play a role in achieving the first and second bistable positions. Modifying any one of these features and/or the housing containing the magnets can affect the resulting bistable positions. In this regard, it is to be appreciated that while only one structural configuration showing the system magnet 106 and hinge magnet 126 is shown, many variations are possible. Further, while the hinge magnet is shown in the context of a charging case assembly, the hinge system can be implemented within other devices or structures that move between first and second positions, such as cases for other devices such as eyeglasses.

Example Position Detecting and Notification Systems

The magnetic bistable hinge system may communicate with other systems positioned within or in communication with the charging device. Examples of such systems may include a position detection system 240 and a notification system 236 (See FIG. 11). But, numerous other systems may be implemented in connection with the position of the hinge, and in particular examples, the position of the hinge magnet 126.

An example position detecting system can be implemented within the charging case 40 to indicate the position of the hinge magnet 126. In one example, the position detecting system can detect the magnitude and strength of the hinge magnet 126 as it rotates bout the hinge bracket.

Figure 10:
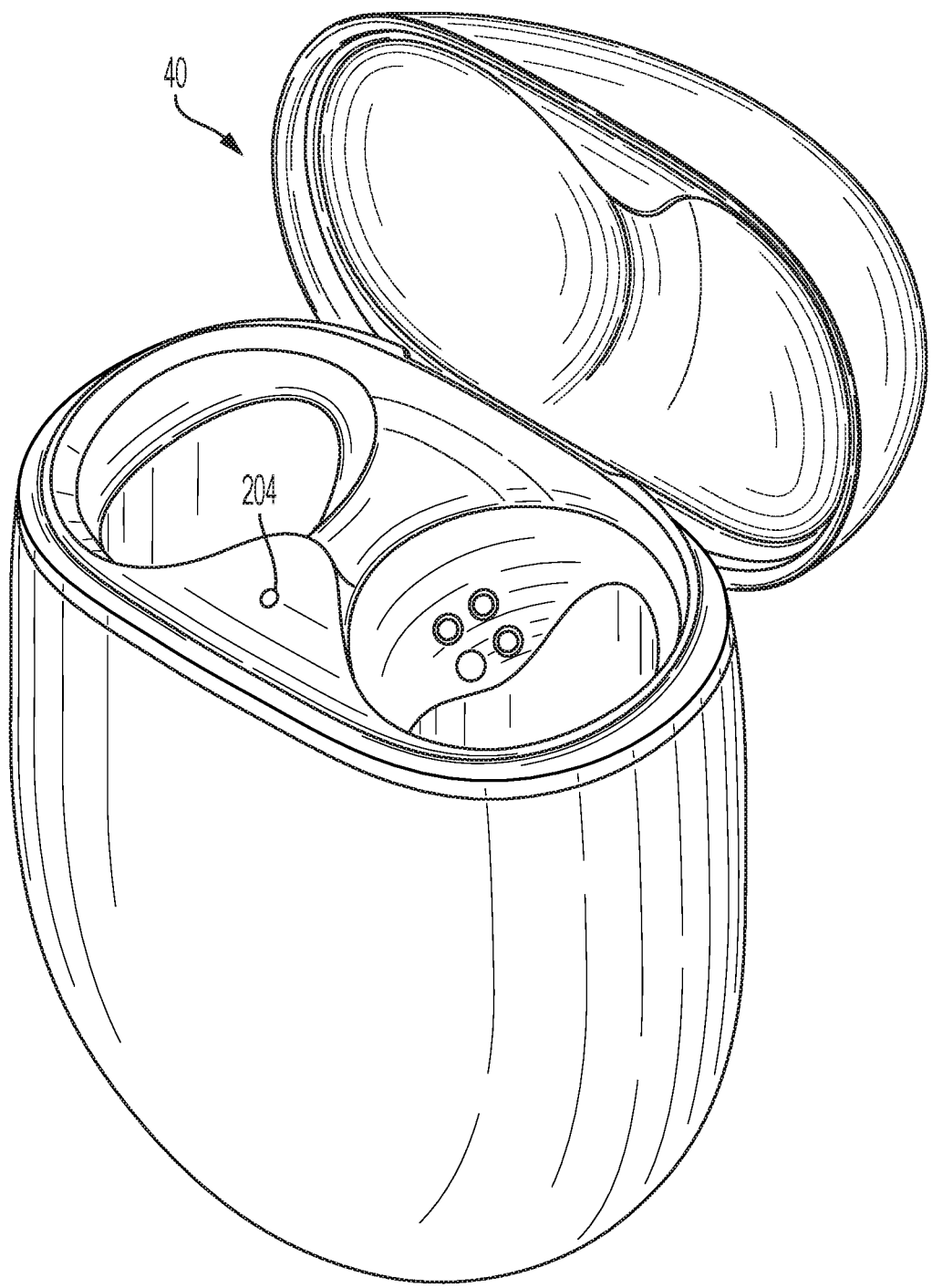
FIG. 10 is a perspective view of an example charging case according to an aspect of the disclosure.

An example notification system can be implemented to notify another system or a user about the position of the hinge magnet 126, rotatable member, and/or the lid 54. In one example, the notification system notifies a user as to whether the lid of the charging device is in an open position or a closed position. For example, as shown in the perspective view of FIG. 10, where the case is in the fully extended position, the charging case may include a light 204, such as an LED. (See FIGS. 10-11.) When the case is in the open position, a light, a certain color of light, a pattern of blinking lights or the like can be emitted to provide a visual notification to a user that the case remains open. In one example, the LED may be a blinking red light to indicate that the case is in an open position. In other examples, different types of visual notification may be provided to a user such as on a graphical user interface. In still other examples, the notification system communicates with another system of the charging device to initiate or commence another action.

Control System for Charging Case

The charging case may also include a control system that can determine whether the lid of the charging case is in an open position or closed position, based on the information received from the position detection system 240. In some examples, when the lid is determined to be in an open or closed position, the control system may provide instructions to another system communicating with the charging case to perform a specific function, such as notify a user that the lid is open or initiate charging of a device within the charging case. The control system may include one or more processors which process information in order to control aspects of the charging case.

Figure 12:
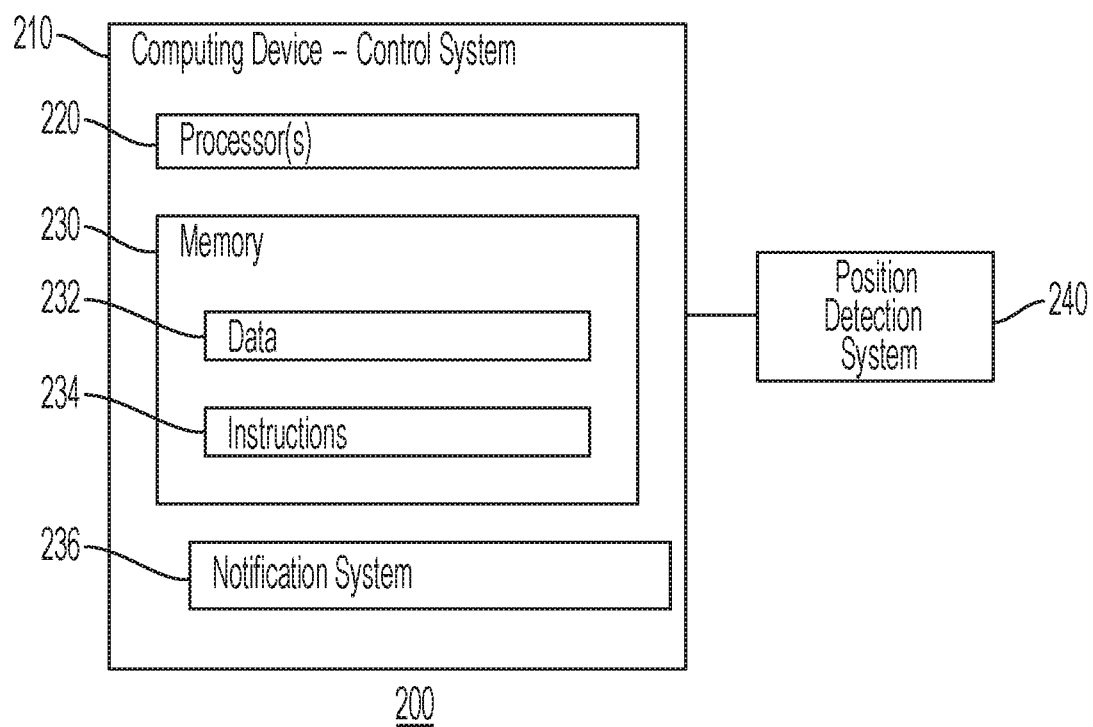
FIG. 12 is an example control system of a charging case according to aspects of the disclosure.

FIG. 12 illustrates an example 200 of a computing device or control system for an electronic device, such as the charging case 50 shown in FIGS. 1-9. The computing device 210 may contain one or more processors, memory, and other components generally found in general purpose computing devices. As shown in FIG. 12, the charging case may have one or more computing devices, such as computing device 210 containing one or more processors 220, memory 230, data 232, instructions 234 and other components typically present in general purpose computing devices.

The memory 230 can store information accessible by the one or more processors 220, including data 232 and instructions 234 that may be executed or otherwise used by the processor 220. The memory 230 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 234 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 232 may be retrieved, stored or modified by processor 220 in accordance with the instructions 234. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 220 may be any conventional processors, such as commercially available CPUs. Alternatively, the one or more processors may be a dedicated device such as an ASIC or other hardware-based processor. Although FIG. 12 functionally illustrates the processor, memory, and other elements of computing device 210 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing device 210. Accordingly, references to a processor or computing device will be understood to include references to a collection of processors or computing devices or memories that may or may not operate in parallel.

In one example, computing device 210 may be a control system incorporated into the charging case. The control system may be capable of communicating with various systems communicating with the charging case 200, such as position detection system 240, which can detect the position of the magnet; or notification system 236 for notifying a user that the lid of the charging case remains open.

Control system 210 may receive signals from other systems in the charging device indicating that the lid of the charging case is in an open or closed position. In such example, such as if the charging case is in the closed position, control system 210 may initiate activity by systems, such as instructing the notification system to notify a user that the lid of the charging case is open. Again, although the notification systems 236 are shown as part of computing device 210, in actuality, the position detection system 240 may be a separate system in communication with control system 210.

With reference to FIGS. 6 and 12, when the control system 210 receives a message from the position detection system 240, the control system can determine the position of the hinge magnet 126 and thereby the lid 54. When the control system determines the hinge magnet 126 is in the first closed position, control system 210 can send instructions to the notification system 236 that the lid is fully closed and a notification to the user does not need to be provided.

Conversely, when the control system 210 receives a message from the position detection system 240 that the hinge magnet 126 and thereby the lid 54 are in the second open position, control system 210 can send instructions to the notification system 236 that the lid is in an open position, control system 210 can send instructions to the notification system 236 that the lid is fully open and a notification to the user can be sent.

The position of the hinge magnet can be determined by the control system. For example, as the hinge magnet 126 rotates about the hinge bracket 116, one or more position sensors within the control system can be used to determine the position of the hinge magnet 126.

For instance, referring to FIGS. 6 and 8, a position sensor 202 may be a hall sensor that is positioned within the charging device 50. In this example, position sensor 202 may be fixed to or formed within the magnet housing 108 of system magnet 106. Position sensor 202 can detect the magnetic field of the hinge magnet 126, as it rotates about the axis of the hinge bracket 116. As noted above, the hinge magnet 126 may be positioned at a base of the rotating assembly plate 118. In one example, the hinge magnet 126 can detect either the hinge magnitude or a change in magnitude as it rotates around the hinge bracket.

Position sensor 202 may communicate with control system 210 to indicate the position of the hinge magnet 126. For example, when hinge magnet 126 is in a first closed position, where hinge magnet 126 indirectly faces system magnet 106 and the system magnet housing 108, position sensor 202 can send a signal to control system 210 indicating the magnitude of hinge magnet 126. In this example, detection of the position of the hinge magnet 126 can also indicate the position of the lid 54 of the charging case 50.

Based on the information received from the position sensor 202, control system 210 can determine the position of the hinge magnet 126, and whether the hinge magnet is in the closed position or whether the hinge magnet has moved to an open position. For example, because the position of the position sensor 202 is fixed, control system 210 can readily determine the position of the hinge magnet 126.

In other examples, control system 210 can determine the exact position of the hinge magnet. For example, multiple hall sensors 210 may be implemented within the charging case to provide additional information to the control system 210 so as to know the exact position of the hinge magnet, as opposed to simply whether the magnet is in an open or closed position. For example, the hinge magnet 126 may be rotated at 20 degrees relative to the position of the hinge magnet 126 in the closed position, which can be used to indicate at least one bistable open position.

Figure 13:
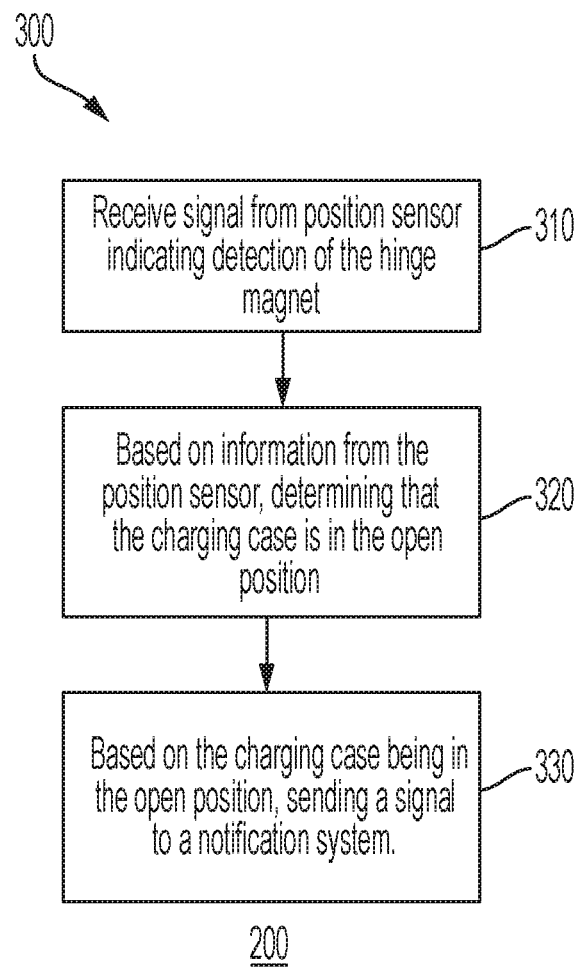
FIG. 13 is an example flow diagram in accordance with aspects of the disclosure.

FIG. 13 is an example flow diagram 300 in accordance with some of the aspects described above that may be performed by one or more computing devices such as control system 210. In this example, control system 210 receives a signal at block 310. The signal can indicate the magnitude or magnetic field generated by the hinge magnet 126. The control system 210 may then determine the position of the hinge magnet 126, which in turn will determine whether the lid 52 is in a closed position or an open position. Control system can further determine whether the open position is the bistable position or other open position. At block 320, the control system 210 can determine that the charging case is in the open position. At block 330, the control system 210 can send a signal to a notification system.

Thus, the features disclosed herein may provide for a magnetic bistable hinge system that can be implemented within any device or system, such as laptops, charging cases, tablets, accessories and the like. The features disclosed herein may address the shortcomings associated with known hinge systems.

Most of the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. As an example, the bistable hinge system is not limited to use in any one device and may be implemented across many products. The provision of the examples described herein, as well as clauses phrased as "such as," "including" and the like, should not be interpreted as limiting the subject matter of the claims to the specific examples; rather, the examples are intended to illustrate only one of many possible embodiments.

The invention claimed is:

1. A hinge system comprising:
a hinge bracket having an axis extending therethrough;
a first magnet coupled to the hinge bracket and configured to rotate about the axis of the hinge bracket from a first position to a second position, the first magnet having first and second poles;
a rotatable member coupled to the hinge bracket and the first magnet;
a second magnet spaced a pre-determined distance away from the first magnet and having first and second poles, wherein the first pole of each of the first and second magnets faces in a direction toward one another; and
a position sensor configured to detect a location of the first magnet,
wherein when the first pole of the first magnet is at a first angle relative to the first pole of the second magnet, the first magnet and the second magnet are in the first position and the rotatable member is in a closed position relative to the hinge bracket, and
wherein when the first pole of the first magnet is at a second angle relative to the first pole of the second magnet, the first magnet and the second magnet are in the second position, and the rotatable member is rotated to an open position relative to the hinge bracket.

2. The hinge system of claim 1, wherein a first size of the first magnet is smaller than a second size of the second magnet.

3. The hinge system of claim 1, wherein the rotatable member includes a first end and an opposed second end, wherein the first magnet is positioned at the first end of the rotatable member, such that movement of the first magnet causes the second end to rotate about the hinge bracket.

4. The hinge system of claim 1, wherein when the first magnet and the second magnet repel each other, the rotatable member is rotated about the axis of the hinge bracket.

5. The hinge system of claim 1, wherein when the first magnet moves from the first position to the second position, the first magnet is rotated at least 20 degrees.

6. The hinge system of claim 1, wherein in the second position the first magnet and the second magnet repel one another.

7. A hinge system comprising:
an outer housing;
a hinge bracket;
an axially rotatable first component coupled to the hinge bracket;
a first magnet coupled to the first component, the first magnet having a first pole and a second pole; and
a second magnet spaced apart from the first magnet, the second magnet having a first pole and a second pole,
wherein the second magnet is further configured to secure a removable and external device to an interior of the outer housing,
wherein the second magnet is positioned at an angle offset from a vertical axis that extends through the second magnet,
wherein the first component is in a first closed state when the second pole of the first magnet indirectly faces in a direction toward the second pole of the second magnet, and
wherein rotation of the first component about the hinge bracket causes the second pole of the first magnet to directly face toward and oppose the second pole of the second magnet, such that the first component moves from the first closed state to a second open state.

8. The hinge system of claim 7, wherein the first magnet is positioned at a base of the first component.

9. The hinge system of claim 7, wherein at least one of the first component or the hinge bracket is comprised of a ferromagnetic material.

10. The hinge system of claim 7, further comprising:
a position sensor configured to detect a location of the first magnet.

11. The hinge system of claim 10, further comprising:
a control device, the control device including one or more processors configured to:
receive a signal from the position sensor indicating a location of the first magnet; and
determine a current position of the first component based on the signal received from the position sensor.

12. A system comprising:
an outer housing;
a rotatable cover coupled to the outer housing;
a first magnet disposed within the outer housing, the first magnet having a first pole and a second pole;
a hinge subassembly disposed within the outer housing, the hinge subassembly further including:
a hinge bracket;
an axially rotatable first component coupled to the hinge bracket and the rotatable cover; and
a second magnet positioned within the first component, the second magnet being rotatable about the hinge bracket, the second magnet spaced away from the first magnet, the second magnet having a first pole and a second pole; and
a position sensor configured to detect a location of the second magnet,
wherein the first component is in a first position when the second pole of the second magnet indirectly faces in a direction toward the second pole of the first magnet, and wherein the first component is in a second position when the second pole of the first magnet directly faces toward and opposes the second pole of the second magnet, such that the first component and the rotatable cover automatically move from the first position to the second position.

13. The system of claim 12, wherein the first magnet is further configured to secure a removable and external device to an interior of the outer housing.

14. The system of claim 13, wherein the first component includes a first end and an opposed second end, wherein the second magnet is positioned at the first end of the first component, such that movement of the first magnet causes the second end to rotate about the hinge bracket.

15. The system of claim 12, further comprising:
a control device, the control device including one or more processors configured to:
  receive a signal from the position sensor indicating the location of the second magnet; and
  determine a current position of the first component based on the signal received from the position sensor.

16. The system of claim 15, wherein the current position of the second magnet further indicates whether the first component is in one of the first position or the second position.

17. The system of claim 15, wherein the position sensor is a hall sensor that detects the location of the second magnet.

18. The system of claim 17, where the position sensor is a plurality of hall sensors.

19. The system of claim 15, wherein the position sensor is positioned within a magnet housing of the first magnet.

* * * * *